United States Patent [19]

Gay

[11] 4,152,664

[45] May 1, 1979

[54] CONSTANT POWER BALANCE CONTROL AND METHOD

[75] Inventor: Michael J. Gay, Geneva, Switzerland

[73] Assignee: Motorola, Inc., Schaumburg, Ill.

[21] Appl. No.: 874,954

[22] Filed: Feb. 3, 1978

[51] Int. Cl.² ............................................. H03G 3/30
[52] U.S. Cl. .................................. 330/254; 330/279; 330/295
[58] Field of Search ................... 330/254, 124 R, 279, 330/295; 179/1 G, 1 GQ, 1 VL

[56] References Cited

U.S. PATENT DOCUMENTS 4,063,032  12/1977  Willcocks ........................ 179/1 GQ Primary Examiner—James B. Mullins
Attorney, Agent, or Firm—Maurice J. Jones; Marvin A. Glazer

[57] ABSTRACT

A circuit is disclosed which provides first and second control voltages for controlling the gains of first and second variable gain amplifiers such that the relative gains provided by the first and second amplifiers can be varied while maintaining the total power gain provided by the first and second amplifiers substantially constant. The first and second control voltages are generated by passing first and second primary currents across semiconductor junctions. The first and second primary currents are controlled respectively by first and second secondary currents, the secondary currents being substantially proportional to the square of the respective primary current. The circuit allows the ratio of the secondary currents to be varied while maintaining the sum of the secondary currents substantially constant. The primary currents are thereby varied such that the sum of the squares of the primary currents remains substantially constant. The controlled variation in the primary currents causes the control voltages to vary in such a manner that the sum of the power gains provided by the first and second amplifiers remains substantially constant.

25 Claims, 5 Drawing Figures

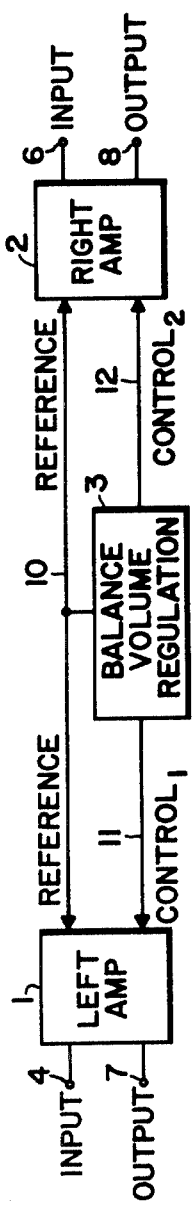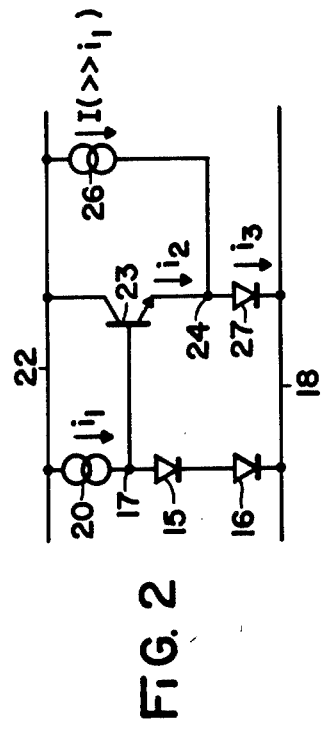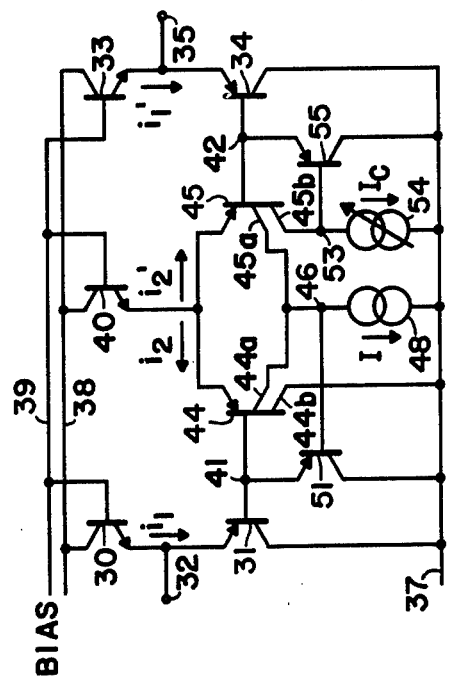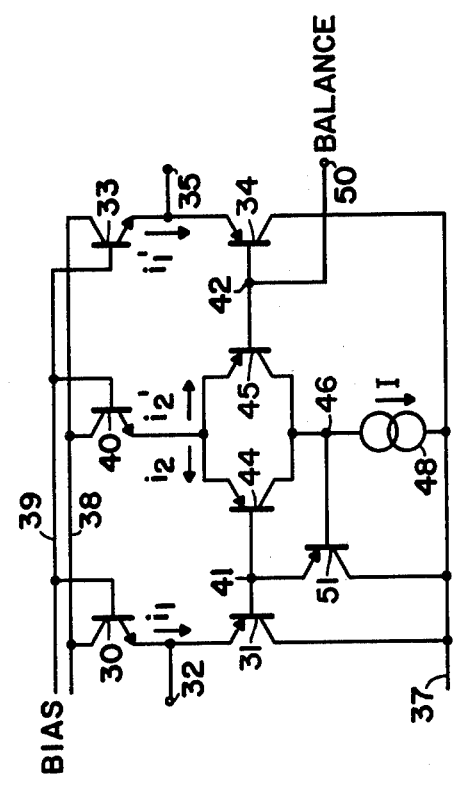
FIG. 1
FIG. 2
FIG. 4
FIG. 3

CONSTANT POWER BALANCE CONTROL AND METHOD

BACKGROUND OF THE INVENTION

1. Field of the Invention

This invention relates generally to amplification circuits and more particularly to a circuit and a method for controlling the relative gains of a first and second amplifier.

2. Description of the Prior Art

In audio systems having two or more channels, some means for adjusting the relative gains of the channels is required. This means is commonly referred to as a balance control. A desirable feature of such an audio system is to maintain the sum of the power gains provided by the channels substantially constant while varying the relative gains of the channels since this provides a substantially constant total audio output power. Existing balance systems do not provide true constant power gain. Although attempts have been made in the past to achieve a constant power gain balance control mechanically via shaped potentiometer laws, no known system has achieved this result electronically.

A stereo control system employing variable gain amplifiers has been disclosed in copending application "Improved Remote Control Amplifier" by Gay, Ser. No. 776,332, now U.S. Pat. No. 4,070,633, "Remote Controlled Amplifier" invented by Gay which is assigned to the assignee of the present invention and which is hereby incorporated by reference. The variable gain amplifiers disclosed in this reference have a gain which is exponentially dependent upon an applied control voltage. The reference disclosed circuitry for adjusting the volume and balance to two such variable gain amplifiers in a stereo control system. The use of variable gain amplifiers is desirable because the audio signal received by the amplifier need not pass through a control potentiometer in order to vary the magnitude of the amplified output signal, thereby avoiding radiation problems which normally result when wires are coupled from the control potentiometer to the signal processing circuit. Instead, the gain is controlled by a d.c. (direct current) voltage which may be generated in a location remote from the variable gain amplifiers. However the prior art does not disclose a circuit or a method for varying the relative gains of two remote controlled amplifiers in such a way that the total power gain remains constant over said variation.

SUMMARY OF THE INVENTION

An object of the present invention is to provide circuitry and a method for varying the relative gains, or balance, of two audio amplification channels such that the sum of the power gains provided by the amplification channels remains substantially constant.

Another object of the present invention is to provide circuitry and a method for varying the relative gains of two audio amlification channels such that the sum of the power gains provided by the amplification channels remains substantially constant and such that the relative gains of the amplification channels can be remotely controlled.

Another object of the present invention is to provide circuitry and a method for controlling the relative gains, or balance, and the total gain, or volume, of two audio amplification channels such that the sum of the power gains provided by the amplification channels remains substantially constant irrespective of variations in the balance control.

Still another object of the present invention is to provide circuitry and a method for providing control voltages to two variable gain amplifiers such that the control voltages can be varied to effect variations in the relative gains of the amplifiers while maintaining the sum of the power gains provided by the amplifiers substantially constant irrespective of the variations in the control voltages.

Briefly described, the present invention relates to a circuit and a method for generating a first and a second control voltage for controlling the gains of a first and a second variable gain amplifier, respectively, such that the relative gains of the first and second amplifier may be varied while maintaining the sum of the power gains provided by the first and second amplifier substantially constant. Each of the control voltages is generated by causing a primary current to flow across a semiconductor junction. Each primary current is responsive to a secondary current such that the secondary current is maintained substantially proportional to the square of the primary current. Circuitry is provided for varying the ratio of the two secondary currents while maintaining the sum of the two secondary currents substantially constant. The primary currents vary in response to variations of the secondary currents but the sum of the squares of the primary currents remains substantially constant. The variations in the primary currents effect variations in the first and second control voltages such that the relative gains of the first and second amplifiers are varied while maintaining the sum of the power gains of the first and second amplifiers substantially constant. Circuitry is also provided for adjusting the total power gain provided by the first and second amplifiers independently of the relative gains of the two amplifiers.

BRIEF DESCRIPTION OF THE DRAWINGS

FIG. 1 is a block diagram of a two channel audio amplifier circuit employing first and second variable gain amplifiers and means for controlling the gains of each of the amplifiers;

FIG. 2 is a circuit diagram serving to illustrate the relationship between a primary current and a second current;

FIG. 3 is a circuit diagram showing one embodiment of the invention for generating first and second control voltages;

FIG. 4 is a circuit diagram showing a second embodiment of the invention for generating first and second control voltages and including transistors having first and second collector terminals.

DESCRIPTION OF THE PREFERRED EMBODIMENT

Figure 5:
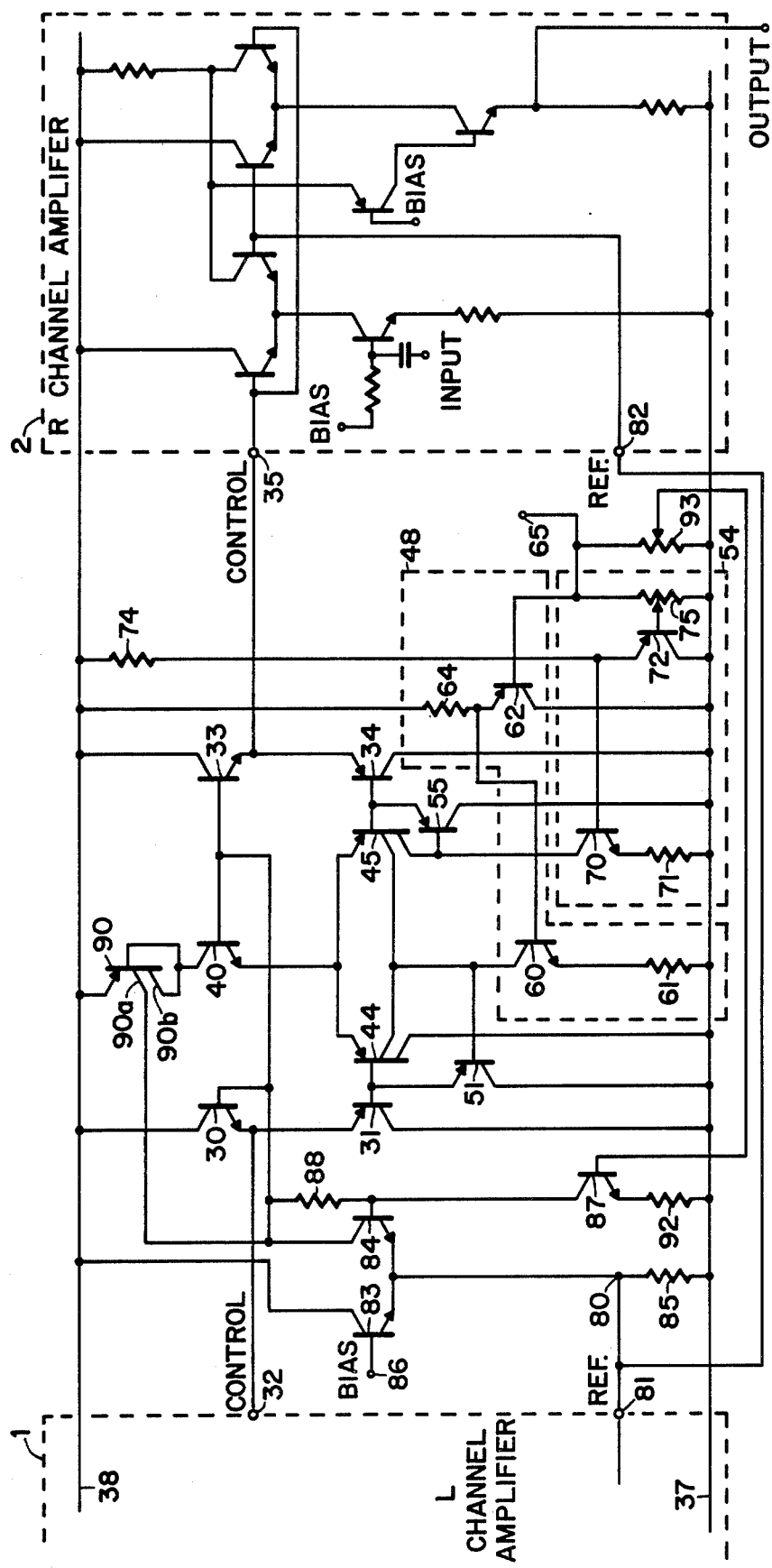
FIG. 5 is a circuit diagram to a two channel amplification system according to a preferred embodiment of the invention which provides means for varying the relative gains and total gains provided by the first and second amplifiers.

The block diagram in FIG. 1 shows an audio amplification system including a first variable gain amplifier 1, a second variable gain amplifier 2, and a balance and volume regulation means 3. The variable gain amplifiers 1 and 2 are of the type more fully described by the disclosure incorporated by reference above. A first audio input signal is received on terminal 4 of amplifier 1 and a second audio input signal is received on terminal 6 of amplifier 2. The amplified audio signals are output on terminals 7 and 8 from amplifier 1 and amplifier 2, respectively. Regulation circuit 3 provides a reference voltage to conductor 10 which is received by variable gain amplifiers 1 and 2. Regulation circuit 3 also provides a first control voltage 11 which is received by amplifier 1, and also provides a second control voltage on conductor 12 which is received by amplifier 2. The gain of amplifier 1 is controlled by the voltage difference between reference conductor 10 and first control voltage conductor 11. Similarly, the gain of amplifier 2 is controlled by the voltage difference between reference voltage conductor 10 and second control voltage conductor 12. The relationship between the gain of each amplifier and its corresponding control voltage is of an exponential form as follows:

$$G = G_0 e^{qv/kT}$$

where G is the voltage gain, $G_0$ is a constant, and v is the corresponding control voltage.

If the difference voltages input to amplifier 1 and amplifier 2 are designated $v_1$ and $v_2$ respectively, then the voltage gains provided by amplifiers 1 and 2 may be written as follows:

$$G_1 = G_0 e^{qv_1/kT}$$

and $$G_2 = G_0 e^{qv_2/kT}$$

The power gain provided by each amplifier is proportional to the square of the voltage gain. Thus for the condition of constant total power gain, the following equation results:

$$G_1^2 + G_2^2 = \text{constant},$$

or by substitution $$e^{2(qv_1/kT)} + e^{2(qv_2/kT)} = \text{constant}.$$

Therefore to achieve constant total power gain, $v_1$ and $v_2$ must be varied in accordance with the above equation in providing balance control.

In order to satisfy the constant total power gain equation first assume that control voltages $v_1$ and $v_2$ are generated by conducting primary currents $i_1$ and $i_2$, respectively, across forward biased semiconductor junctions. The voltage-current relationship exhibited by a semiconductor junction is of a form well known in the art. If representations for $v_1$ and $v_2$ in terms of $i_1$ and $i_2$ are substituted into the constant total power gain equation above, the equation becomes upon further simplification, $$i_1^2 + i_2^2 = \text{constant}.$$

In the foregoing discussion it has been assumed that the variable gain amplifiers are so connected that increasing the control voltages increases their gains. However, they may be connected conversely so that increasing the control voltages decreases their gains. In this case, the relationship between the gain and control voltage is given by:

$$G = G_0 e^{-qv/kT}$$

and the condition for constant total power gain is the following:

$$e^{-2(qv_1/kT)} + e^{-2(qv_2/kT)} = \text{constant}.$$

In these circumstances, which apply to the preferred embodiment, the control voltages developed across the forward biased semiconductor junctions by primary currents $i_1$ and $i_2$ must be considered negative voltages. Again, substitution of the representations for $-v_1$ and $-v_2$ in terms of $i_1$ and $i_2$ into the constant total power gain equation results in the relationship $$i_1^2 + i_2^2 = \text{constant}.$$

To develop a circuit which will insure the above condition, it is first necessary to develop secondary currents which are proportional to the squares of the primary currents, $i_1$ and $i_2$.

FIG. 2 demonstrates a circuit which maintains a secondary current $i_2$ proportional to the square of a primary current $i_1$. A pair of semiconductor junctions 15 and 16 are coupled in series between a node 17 and a first voltage conductor 18. A current source 20 providing current $i_1$ is coupled between node 17 and a second voltage conductor 22. Thus a current $i_1$ is forced to flow across semiconductor junctions 15 and 16. The resulting voltage on node 17 corresponds to the sum of the forward voltage diode drops provided by diodes 15 and 16 as determined by current $i_1$.

Node 17 is also coupled to the base of transistor 23, which also has a collector terminal coupled to second voltage conductor 22 and an emitter terminal coupled to node 24. The emitter current flowing in transistor 23 is designated $i_2$ and corresponds to the secondary current. Coupled between node 24 and second voltage conductor 22 is current source 26 which supplies a current I that is much larger in magnitude than current $i_1$ supplied by current source 20. Also coupled to node 24 is one terminal of semiconductor junction 27 having its other terminal coupled to first voltage conductor 18. Thus transistor 23 and diode 27 comprise a second pair of series coupled semiconductor junctions which are coupled in parallel with series coupled junctions 15 and 16.

The current $i_3$ which flows in diode 27 is the sum of current $i_2$ supplied by transistor 23 plus current I supplied by current source 26. Because of the relatively large magnitude of current I, the voltage at node 24 will remain substantially constant despite variations in current $i_2$. The sum of the junction voltages provided by diodes 15 and 16 must equal the sum of the junction voltages provided by diode 27 and transistor 23. If the junction voltages are expressed in terms of the currents which flow in each of the junctions, it can be shown that $i_2$ times $i_3$ equals $i_1^2$, assuming that all of the junctions have matched characteristics. If the junctions are not matched to each other, a constant term will appear in the equation. Since $i_3$ is substantially a constant (I), secondary current $i_2$ will be substantially proportional to the square of primary current $i_1$.

FIG. 3 shows a first embodiment of the invention employing two primary currents ($i_1$, $i_1'$) and two secondary currents ($i_2$, $i_2'$). The first primary current $i_1$ is caused to flow in series coupled transistors 30 and 31 which have a common coupling point connected to output terminal 32 for providing a first control voltage. A second primary current $i_1'$ is caused to flow in series coupled transistors 33 and 34 which have a common coupling point coupled to output terminal 35 for providing a second control voltage. The collector terminals of transistors 31 and 34 are coupled to a first voltage conductor 37 while the collectors of transistors 30 and 33 are coupled to a second voltage conductor 38. The base terminals of transistors 30 and 33 are coupled to bias voltage conductor 39 which is also coupled to the base terminal of transistor 40. The base terminal of transistor 31 is coupled to node 41 and the base terminal of transistor 34 is coupled to node 42. Thus primary current $i_1$ is controlled by the voltage difference between this voltage conductor 39 and node 41 applied across the series coupled emitter-base junctions of transistors 30 and 31. Similarly, primary current $i_1'$ is determined by the voltage difference between bias voltage conductor 39 and node 42.

Secondary currents $i_2$ and $i_2'$ are supplied from the emitter of transistor 40, the collector of which is coupled to second voltage conductor 38. Secondary current $i_2$ is conducted by transistor 44, having its emitter coupled to the emitter of transistor 40 and its base coupled to node 41. Secondary current $i_2'$ is conducted by transistor 45 which has its emitter coupled to the emitter of transistor 40 and its base coupled to node 42. Thus, the voltage across the series coupled emitter-base junctions of transistors 30 and 31 is controlled by the voltage generated across the series coupled emitter-base junctions of transistors 40 and 44. Similarly, the voltage across the series coupled emitter-base junctions of transistors 33 and 34 is controlled by the voltage developed across the series coupled emitter-base junctions of transistors 40 and 45.

The collectors of transistors 44 and 45 are coupled to a common node 46 which is also coupled to one terminal of a current source 48 having its other terminal coupled to the first voltage conductor 37. Since the collector currents of transistors 44 and 45 are substantially equal to their emitter currents ($I_2$ and $i_2'$), the sum of the secondary currents $i_2$ and $i_2'$ is substantially equal to the current I supplied by current source 48. Since transistor 40 conducts the sum of the current $i_2$ plus $i_2'$, a substantially constant current I flows in transistor 40; therefore the voltage across the emitter-base junction of transistor 40 is substantially constant. However the relative magnitudes of the secondary currents $i_2$ and $i_2'$ may be varied by adjusting the biasing potentials across transistors 44 and 45. Node 42 is shown coupled to an input terminal 50 for receiving a balance voltage which regulates the conductivity of transistor 45. A feedback transistor 51 is shown having its base coupled to node 46 and its emitter coupled to node 41. Feedback transistor 51 is operative to control the bias across transistor 44 for adjusting the magnitude of the current conducted by transistor 44 to be equal to the difference between current I supplied by current source 48 and current $i_2'$ conducted by transistor 45.

As was already described with reference to FIG. 2, primary current $i_1$ is proportional to the square of secondary current $i_2$, and primary current $i_1'$ is proportional to the square of secondary current $i_2'$, while the sum of the secondary currents $i_2$ and $i_2'$ is equal to a constant current I. Thus the circuit described in FIG. 3 provides a means for varying primary currents $i_1$ and $i_1'$ while maintaining the sum of the squares of the primary currents constant. The resultant control voltages output at terminals 32 and 35 allow variation in the gains of the first and second variable gain amplifiers (shown in FIG. 1) while maintaining the sum of the power gains provided by the amplifiers substantially constant. Transistors 30 and 31 therefore comprise a first control means for generating the first control voltage, transistors 33 and 34 comprise a second control means for generating a second control voltage, and transistors 40, 44 and 45 comprise a regulating means for varying the first and second control voltages.

FIG. 4 is a circuit drawing showing another embodiment of the invention. Much of the circuitry is identical to that shown in FIG. 3 except that transistors 44 and 45 have each been modified to include first and second collector terminals (designated a and b). In this preferred embodiment, the characteristics of transistors 44 and 45 are assumed to be such that the current conducted by collector "a" is identical to the current conducted by collector "b" by virtue of the "a" and "b" collector geometries being equal in each transistor. In other embodiments these collector geometries may be varied such that collectors "a" and "b" conduct ratioed currents. Collectors 44a and 45a are again coupled to node 46 and to current source 48. Secondary current $i_2$ now equals the sum of the currents conducted by collector 44a and 44b. Likewise, secondary current $i_2'$ is now equal to the sum of the currents conducted by collectors 45a and 45b. Since the sum of the currents in collectors 44a and 45a is constant, the sum of the secondary currents $i_2$ and $i_2'$ is also constant, again resulting in the emitter base-junction voltage of transistor 40 being substantially constant.

Collector 45b is coupled to node 53 and to one terminal of variable current source 54 having a second terminal connected to first voltage conductor 37. The current $I_C$ supplied by variable current source 54 may be varied in the range from zero to I, the current supplied by first current source 48. A second feedback transistor 55, having its base coupled to node 53 and its emitter coupled to node 42, regulates the bias voltage across transistor 45 such that the collector current conducted by collector 45b equals the current supplied by variable current source 54. Collector 45a is forced to conduct a current equal to that conducted by collector 45b. First feedback transistor 51, coupled between node 46 and node 41, regulates the bias voltage across transistor 44 such that the current conducted by collector 44a equals the difference between the current I supplied by current source 48 and the current conducted by collector 45a. The current conducted by collector 44b equals the current conducted by collector 44a and is returned to the first voltage conductor 37. Thus, variable current source 54 and second feedback transistor 50 provide a balance means for varying the secondary currents and in turn varying the primary currents which produce the control voltages.

The primary currents, $i_1$ and $i_1'$, are equal, and thus the gains of the two variable gain amplifiers are equal, when the current supplied by current source 54 is half the current supplied by current source 48. Also, when variable current source 54 is reduced to zero, the power gain of the variable gain amplifier controlled by output terminal 32 doubles while the power gain of the variable gain amplifier controlled by output terminal 35 is reduced to substantially zero. Conversely, when the current supplied by variable current source 54 equals the current supplied by current source 48, the power gain of the variable gain amplifier controlled by output 32 is substantially zero while the power gain of the variable gain amplifier controlled by output terminal 35 is double the power gain provided when the current supplied by variable current source 54 is only half the current supplied by current source 48. It will be appreciated by those skilled in the art that this circuit provides a very convenient balance control law.

FIG. 5 is a detailed circuit schematic showing the preferred embodiment of the invention. The circuit includes a first variable gain amplifier 1 and a second variable gain amplifier 2 comprising left and right channel amplifiers for an audio amplifier system. The voltages developed across the emitter-base junctions of transistors 30 and 33 provide first and second control voltages, respectively, at terminals 32 and 35 for controlling the gains of the first and second variable gain amplifiers.

Also shown in FIG. 5 (within dashed block 48) is the circuitry for current source 48 of FIG. 4. A transistor 60 has its emitter coupled to first voltage conductor 37 via resistor 61, and its base coupled to the emitter of emitter follower transistor 62 and also to one terminal of resistor 64, the other terminal of which is connected to second voltage conductor 38. The voltage of the base of emitter follower transistor 62 is determined by a control bias voltage applied to terminal 65.

Also shown in FIG. 5 (within dashed block 54) is the circuitry for variable current source 54 of FIG. 4. A transistor 70 has its emitter coupled to first voltage conductor 37 via resistor 71, and its base coupled to the emitter of emitter follower transistor 72 and to one terminal of resistor 74 which has its other terminal coupled to second voltage conductor 38. Emitter follower transistor 72 has its base coupled to potentiometer 75, which is coupled between the control bias supplied at terminal 65 and first voltage conductor 37. Thus it will be noted that the current $I_C$ provided by the collector of transistor 70 of variable current source 54 can be varied in the range of zero to I, where I is the current provided by the collector of transistor 60 of current source 48, provided that the value of resistor 71 is selected to be equal to the value of resistor 61.

The first and second control voltages supplied at terminals 32 and 35, respectively, are measured with respect to a common reference voltage generated at node 80 and applied to reference voltage terminals 81 and 82 for the first and second variable gain amplifiers, respectively. Node 80 is the common emitter coupling between transistors 83 and 84, which comprise an amplifier for generating the reference voltage developed at node 80, and also for generating a bias voltage applied to the bases of transistors 30, 33, and 40. The base of transistor 83 is biased with a voltage supplied at terminal 86 which is selected to be approximately one base-emitter voltage drop above the desired minimum values for the first and second control voltages supplied at terminals 32 and 35. The voltage at the emitter of transistor 83 provides the reference voltage required at terminals 81 and 82. The base of transistor 84 is coupled via resistor 88 to the collector of transistor 84, and also to the collector of transistor 87, the function of which will be later described. The collector of transistor 84 generates the bias voltage applied to the bases of transistors 30, 33, and 40.

The first control voltage generated at terminal 32 is equal to the voltage at the collector of transistor 84 minus the base-emitter voltage drop of transistor 30. Likewise, the second control voltage supplied to terminal 35 is equal to the collector voltage of transistor 84 minus the base-emitter voltage drop of transistor 33.

Thus, it will be appreciated that changes in the bias voltage generated at the collector of transistor 84 can be used to simultaneously raise or lower the first and second control voltages without changing the voltage difference between the first and second control voltages. In this manner, the volume provided by the first and second variable gain amplifiers may be modified without changing the relative balance between the first and second amplifiers. The volume control means for varying the collector voltage of transistor 84 will be described later.

As has already been mentioned, the amplifier comprised by transistors 83 and 84 also generates the reference voltage applied to reference terminals 81 and 82. In order that the reference voltage correlate to the minimum first and second control voltages, a current mirror arrangement is used to force the current in transistor 84 to correlate with the current in transistor 40, equal to the sum of the secondary currents conducted by transistors 44 and 45. The collector of transistor 40 is coupled to the base of dual collector transistor 90 and to collector 90b. A current is biased to flow through collector 90a which ratios to the collector current of transistor 40. The current conducted by collector 90a is supplied to the collector and base of transistor 84 such that the base-emitter voltage drop of transistor 84 closely matches the base-emitter voltage drop of transistor 40. Therefore the reference level produced at node 80 will be correlated with the first and second control voltages, it being assumed that the voltage drop across resistor 88 due to the base current of transistor 84 is negligible.

To effect volume control, the collector voltage of transistor 84 can be raised by increasing the voltage drop which occurs across resistor 88 with additional current supplied by the collector of transistor 87. Transistor 87, resistor 92, and potentiometer 93 comprise a variable current source for adjusting the current in resistor 88 and thus the bias voltage supplied to the bases of transistors 30, 33, and 40. In the embodiment shown in FIG. 5, raising the first and second control voltages will reduce the gain of the first and second amplifiers. Thus to decrease the volume, the current in transistor 87 is increased by raising the base voltage with potentiometer 93.

Thus, a circuit and a method have been disclosed for controlling the gains of first and second variable gain amplifiers which allows for variations in the relative gains of the amplifiers while maintaining the sum of the power gains provided by the amplifiers substantially constant. While particular embodiments of the invention have been shown and described, it is obvious that modifications may be made. The following claims are intended to cover all such modifications as fall within the spirit and scope of the invention.

What is claimed is:
1. A circuit for regulating the gain of at least a first and a second variable gain amplifier, said amplifiers each being responsive to a control voltage and each providing power gain, comprising:
   (a) first control means for conducting a first current and being responsive to the first current for generating a first control voltage, said first control voltage being for controlling the gain of the first amplifier;
   (b) second control means for conducting a second current and being responsive to the second current for generating a second control voltage, said sec- ond control voltage being for controlling the gain of the second amplifier; and (c) regulating means coupled to said first and second control means for varying said first and second control voltages such that the sum of the power gains provided by the first and second amplifiers is substantially constant, said regulating means including balance means for varying said first and second currents to effect variation in the gains of said amplifiers such that the sum of the squares of said first and second currents is substantially constant.

2. A circuit as recited in claim 1 wherein said regulating means comprises volume control means for varying said first and second control voltages by equal amounts and in the same direction such that the sum of the power gains of said amplifiers is varied.

3. A circuit as recited in claim 2 wherein each of said first and second control means comprises at least one semiconductor junction.

4. A circuit for regulating the gain of at least a first and second variable gain amplifier, each of said amplifiers providing power gain and each being responsive to a control voltage such that the gain of each amplifier is exponentially related to its control voltage, said circuit comprising:

(a) first and second primary current means coupled to said first and second amplifiers, respectively, for providing first and second control voltages to said first and second amplifiers, respectively, for controlling the gain of said amplifiers, said first and second primary current means having first and second currents, respectively, flowing therethrough, (b) secondary current means coupled to said first and second primary current means and having third and fourth currents flowing therethrough, said secondary current means being for varying said third and fourth currents such that the sum of said third and fourth currents is substantially constant, wherein said first current is substantially proportional to the square of said third current, and said second current is substantially proportional to the square of said fourth current, said first and second control voltages being responsive to said first and second currents, respectively, such that the sum of the power gains of said amplifiers is maintained substantially constant.

5. A circuit as recited in claim 4 wherein said first and second primary current means each comprise first and second semiconductor junctions for conducting said first and second currents and for generating said first and second control voltages, respectively.

6. A circuit as recited in claim 5 wherein said first and second semiconductor junctions are coupled in series with each of said first and second primary current means.

7. A circuit as recited in claim 6 wherein said first control voltage is generated at the coupling between said first and second series coupled semiconductor junctions within said first primary current means, and said second control voltage is generated at the coupling between said first and second series coupled semiconductor junctions within said second primary current means.

8. A method for varying the gain of a first and a second variable gain amplifier such that the sum of the power gains of said first and second variable gain amplifiers is substantially constant, said first and second variable gain amplifiers being responsive to first and second control voltages, respectively, said method comprising:

(a) providing a first current to a first semiconductor junction for generating said first control voltage, (b) providing a second current to a second semiconductor junction for generating said second control voltage, (c) varying the ratio of said first current to said second current for varying the gains of said first and second amplifiers, and (d) maintaining the sum of the squares of said first and second current substantially constant.

9. A circuit for regulating the gain of at least a first and a second variable gain amplifier each of said first and second variable gain amplifiers providing power gain and each being responsive to a control voltage such that the gain of each amplifier is exponentially related to its control voltage, comprising:

(a) second current means having first and second currents flowing therethrough, (b) balance means coupled to said secondary current means for regulating the magnitude of one of said first and second currents, (c) feedback means coupled to said secondary current means for regulating the magnitude of the other of said first and second currents such that the sum of said first and second currents remain substantially constant, (d) first and second primary current means for conducting third and fourth currents respectively, said first primary current means being responsive to said first current such that said third current is substantially proportional to the square root of said first current, and said second primary current means being responsive to said second current such that said fourth current is substantially proportional to the square root of said second current, said first and second primary current means providing first and second control voltages to said first and second variable gain amplifiers such that the sum of the power gains of said first and second variable gain amplifiers is substantially constant.

10. A circuit as recited in claim 9 wherein said secondary current means comprises at least first and second semiconductor junctions coupled in series, said first junction being operative to conduct said first current, and said second junction being operative to conduct a current of a substantially constant magnitude.

11. A circuit as recited in claim 10 wherein said first primary current means comprises third and fourth semiconductor junctions coupled in series, said third and fourth series coupled junctions being coupled in parallel to said first and second series coupled junctions, said third and fourth junctions being operative to conduct said third current, and said first control voltage being generated at the coupling between said third and fourth series coupled junctions.

12. A method for varying the gain of at least a first and a second variable gain amplifier such that the sum of the power gains of said first and second variable gain amplifiers is substantially constant, said first and second variable gain amplifiers being responsive to first and second control voltages respectively, said method comprising:

(a) providing a first and a second secondary current, (b) varying the ratio of said first secondary current to said second secondary current, (c) maintaining the sum of said first and second secondary currents substantially constant, (d) providing a first primary current to a first semiconductor junction for generating said first control voltage, said first primary current being substantially proportional to the square root of said first secondary current, and (e) providing a secondary primary current to a second semiconductor junction for generating said second control voltage, said second primary current being substantially proportional to the square root of said second secondary current.

13. An audio amplifier current for amplifying at least two audio input signals and providing at least two audio output signals comprising:

(a) at least a first and a second variable gain amplifier responsive to a first and a second control voltage, respectively, said variable gain amplifiers each providing power gain, (b) first control means coupled to said first variable gain amplifier and being operative to conduct a first current for generating said first control voltage, (c) second control means coupled to said second variable gain amplifier and being operative to conduct a second current for generating said second control voltage, and (d) regulating means coupled to said first and second control means for varying said first and second currents such that the sum of the squares of said first and second currents remains substantially constant wherein the gains of said first and second amplifiers are varied such that the sum of the power gains of said first and second amplifiers is maintained substantially constant.

14. An audio amplifier circuit as recited in claim 13 wherein said first and second variable gain amplifiers, said first and second control means, and said regulating means are all fabricated within a monolithic integrated circuit.

15. A circuit for regulating the gain of at least a first and a second variable gain amplifier, said first and second variable gain amplifiers being responsive to first and second control voltages, comprising:

(a) a first and a second transistor having at least emitter and base terminals, the emitters of said first and second transistor being coupled in common, (b) a third transistor having at least emitter and base terminals, the emitter being coupled to the common emitters of said first and second transistors, (c) a fourth and a fifth transistor having at least emitter and base terminals, the base of the fourth transistor being coupled to the base of the third transistor, the emitter of the fourth transistor being coupled to the emitter of the fifth transistor and to a first output terminal for providing said first control voltage, and the base of the fifth transistor being coupled to the base of the first transistor, (d) a sixth and a seventh transistor having at least emitter and base terminals, the base of the sixth transistor being coupled to the base of the third transistor, the emitter of the sixth transistor being coupled to the emitter of the seventh transistor and to a second output terminal for providing said second control voltage, and the base of the seventh transistor being coupled to the base of the second transistor, and (e) means coupled to said first and second transistor for supplying a first and second current to said first and second transistors, respectively, and for varying said first and second currents such that the sum of said first and second currents is substantially constant.

16. A circuit as recited in claim 15 wherein said first and second transistor each include first collector terminals.

17. A circuit as recited in claim 16 wherein said means comprises:

(a) a first current source having current I coupled to the first collectors of said first and second transistors for providing said first and second current, (b) balance means coupled to said second transistor for adjusting the voltage across the emitter and base terminals of said second transistor such that said second current is varied, (c) feedback means coupled to said first transistor and responsive to said second current for regulating the voltage across the emitter and base terminals of said first transistor such that the sum of said first and second current substantially equals the current I supplied by said first current source.

18. A circuit as recited in claim 17 wherein said feedback means comprises a first feedback transistor having at least emitter and base terminals, the emitter being coupled to the base of said first transistor and the base being coupled to the first collector of said first transistor.

19. A circuit as recited in claim 18 wherein said circuit is fabricated as a monolithic integrated circuit.

20. A circuit as recited in claim 18 wherein said first and second transistor each include second collector terminals being operative to conduct a current in a predetermined ratio to the current conducted by said first collector terminal, and said balance means comprises a second current source coupled to the second collector of said second transistor, said second current source having a current of variable magnitude, and a second feedback transistor having at least base and emitter terminals, the base being coupled to the second collector of the second transistor, and the emitter being coupled to the base of said second transistor.

21. A circuit as recited in claim 20 further comprising volume means coupled to said third, fourth, and sixth transistors, providing a variable voltage to the base terminals of said third, fourth and sixth transistors for varying said first and second control voltages independently of said balance means.

22. A circuit as recited in claim 21 wherein said circuit is fabricated as a monolithic integrated circuit.

23. A method for varying the gain of at least a first and a second variable gain amplifier such that the sum of the power gains of said first and second variable gain amplifiers is substantially constant, said method comprising:

(a) providing a first and a second secondary current, (b) varying the ratio of said first secondary current to said second secondary current, (c) maintaining the sum of said first and second secondary currents substantially constant, (d) providing a first primary current to a first semiconductor junction for generating a first control voltage, said first primary current being substantially proportional to the square root of said first secondary current, (e) providing a second primary current to a second semiconductor junction for generating a second control voltage, said second primary current being substantially proportional to the square root of said second secondary current, and (f) controlling the gain of said first variable gain amplifier with said first control voltage, and controlling the gain of said second variable gain amplifier with said second control voltage.

24. An amplification circuit comprising:

(a) at least first and second variable gain amplifiers, each of said amplifiers providing power gain, and each of said amplifiers being responsive to an associated control voltage such that the power gain of each of said amplifiers is exponentially dependent upon its associated control voltage;

(b) first control means for generating a first control voltage, said first control voltage being for controlling the gain of said first amplifier;

(c) second control means for generating a second control voltage, said second control voltage being for controlling the gain of said second amplifier; and (d) regulating means coupled to said first and second control means for varying said first and second control voltages such that the sum of the power gains provided by said first and second amplifiers is equal to a predetermined composite power over variations in said first and second control voltages.

25. An amplification circuit as recited in claim 24 further comprising means coupled to said regulating means for selecting the predetermined composite power gain.

* * * * *